(12) United States Patent
Lo

(10) Patent No.: US 6,452,462 B2
(45) Date of Patent: Sep. 17, 2002

(54) BROADBAND FLEXIBLE PRINTED CIRCUIT BALUN

(75) Inventor: Zane Lo, Merrimack, NH (US)

(73) Assignee: BAE Systems Information and Electronics Systems Integration Inc., Nashua, NH (US)

( * ) Notice: Subject to any disclaimer, the term of this patent is extended or adjusted under 35 U.S.C. 154(b) by 0 days.

(21) Appl. No.: 09/845,998

(22) Filed: Apr. 30, 2001

Related U.S. Application Data
(60) Provisional application No. 60/201,165, filed on May 2, 2000, and provisional application No. 60/210,738, filed on Jun. 12, 2000.

(51) Int. Cl.[7] .................................................. H01P 5/10
(52) U.S. Cl. ............................ 333/26; 343/767; 333/33
(58) Field of Search ................................. 333/22 R, 26, 333/33; 343/767, 795

(56) References Cited

U.S. PATENT DOCUMENTS

| | | | |
|---|---|---|---|
| 3,784,933 A | * | 1/1974 | Scherer et al. ................. 333/26 |
| 4,085,391 A | * | 4/1978 | Schiek et al. ................ 333/246 |
| 4,876,552 A | * | 10/1989 | Zakman ....................... 343/702 |
| 5,036,335 A | * | 7/1991 | Jairam ......................... 343/767 |
| 5,278,575 A | * | 1/1994 | Thomas ....................... 343/795 |
| 5,422,609 A | * | 6/1995 | Ho et al. ....................... 333/26 |
| 5,519,408 A | * | 5/1996 | Schnetzer .................... 343/767 |
| 5,541,611 A | * | 7/1996 | Peng et al. .................. 343/767 |
| 6,075,493 A | * | 6/2000 | Sugawara et al. .......... 343/767 |
| 6,170,154 B1 | * | 1/2001 | Swarup ....................... 29/830 |

OTHER PUBLICATIONS

Sugawara et al., A MM–Wave Tapered Slot Antenna with Improved Radiation Pattern, 1997, WE3F–55 IEEE MTT–S, p959–962.*

* cited by examiner

Primary Examiner—Robert Pascal
Assistant Examiner—Dean Takaoka
(74) Attorney, Agent, or Firm—Salzman & Levy

(57) ABSTRACT

The present invention provides a compact slotline balun implemented on a 10-mil thick printed circuit card. The balun utilizes a transition region configuration of a six-port network to achieve a good impedance match and low insertion loss across a wide operating band. The balun is typically manufactured using standard printed circuit techniques which yield a thin, flexible, dimensionally stable device.

10 Claims, 5 Drawing Sheets

BROADBAND FLEXIBLE PRINTED CIRCUIT BALUN

RELATED APPLICATIONS

This application claims priority to U.S. Provisional Patent Applications Serial No. 60/201,165, filed May 2, 2000 and Ser. No. 60/210,738, filed Jun. 12, 2000.

FIELD OF THE INVENTION

The present invention relates to baluns and, more specifically, to a compact, broadband, flexible printed circuit balun utilizing a six-port network.

BACKGROUND OF THE INVENTION

Baluns are used to provide an impedance-matched transition between a balanced and an unbalanced transmission line. They have been implemented in a variety of ways, such as with lumped constant reactive components.

At higher frequencies (e.g., microwave), the performance of a balun becomes critical from the point of view of both size and performance. For example, in a microwave antenna array, each antenna element may require an individual balun near the antenna element itself. This dictates a design that is compact and, due to the potentially large numbers needed in a large antenna array, low cost.

A typical prior art balun consists of a coaxial twin lead cable and a 180° hybrid transformer. This balun is both bulky and expensive. To overcome these difficulties, a slotline balun utilizing a metal (e.g., aluminum) substrate with the slotline etched in the aluminum was developed, as shown in FIG. 1. In this design, a transition region was used to couple a coaxial connector to the slotline, which was subsequently coupled to a slot radiator. While this design exhibited improved electrical performance over other baluns of the prior art, it was still expensive and did not provide the broadband performance required for certain antenna-related applications. Because it was a rigid metal structure, it exhibited excessive stress concentration points that made it inherently unreliable. In addition, the manufacturing cost was objectionably high.

It is therefore an object of the invention to provide a compact slotline balun having a wide operating bandwidth.

It is a further object of the invention to provide a compact slotline balun having a wide operating bandwidth utilizing a six-port network.

It is an additional object of the invention to provide a compact slotline balun having a low insertion loss across a wide operating bandwidth.

It is another object of the invention to provide a compact slotline balun having a thin cross section for implementation on a printed circuit card.

It is a still further object of the invention to provide a compact slotline balun having a very low manufacturing cost.

It is yet another object of the invention to provide a compact slotline balun having good dimensional stability to ensure high performance reliability.

It is a still further object of the invention to provide a compact slotline balun which may be readily integrated with patch antenna elements formed using conventional printed circuit technology.

It is an additional object of the invention to provide a compact printed circuit slotline balun which is flexible.

SUMMARY OF THE INVENTION

In accordance with the present invention, there is provided a compact slotline balun implemented on a 10-mil thick printed circuit card. The inventive balun utilizes a transition region configuration of a six-port network to achieve a good impedance match and low insertion loss across a wide operating band. The balun is typically manufactured using standard printed circuit techniques which yield a thin, flexible, dimensionally stable device.

BRIEF DESCRIPTION OF THE DRAWINGS

A complete understanding of the present invention may be obtained by reference to the accompanying drawings, when considered in conjunction with the subsequent detailed description, in which.

DESCRIPTION OF THE PREFERRED EMBODIMENT

The present invention features a compact, wideband, printed circuit slotline balun. The inventive balun utilizes a transition region configuration of a six-port network to achieve a good impedance match and low insertion loss across a wide operating band.

Figure 1:
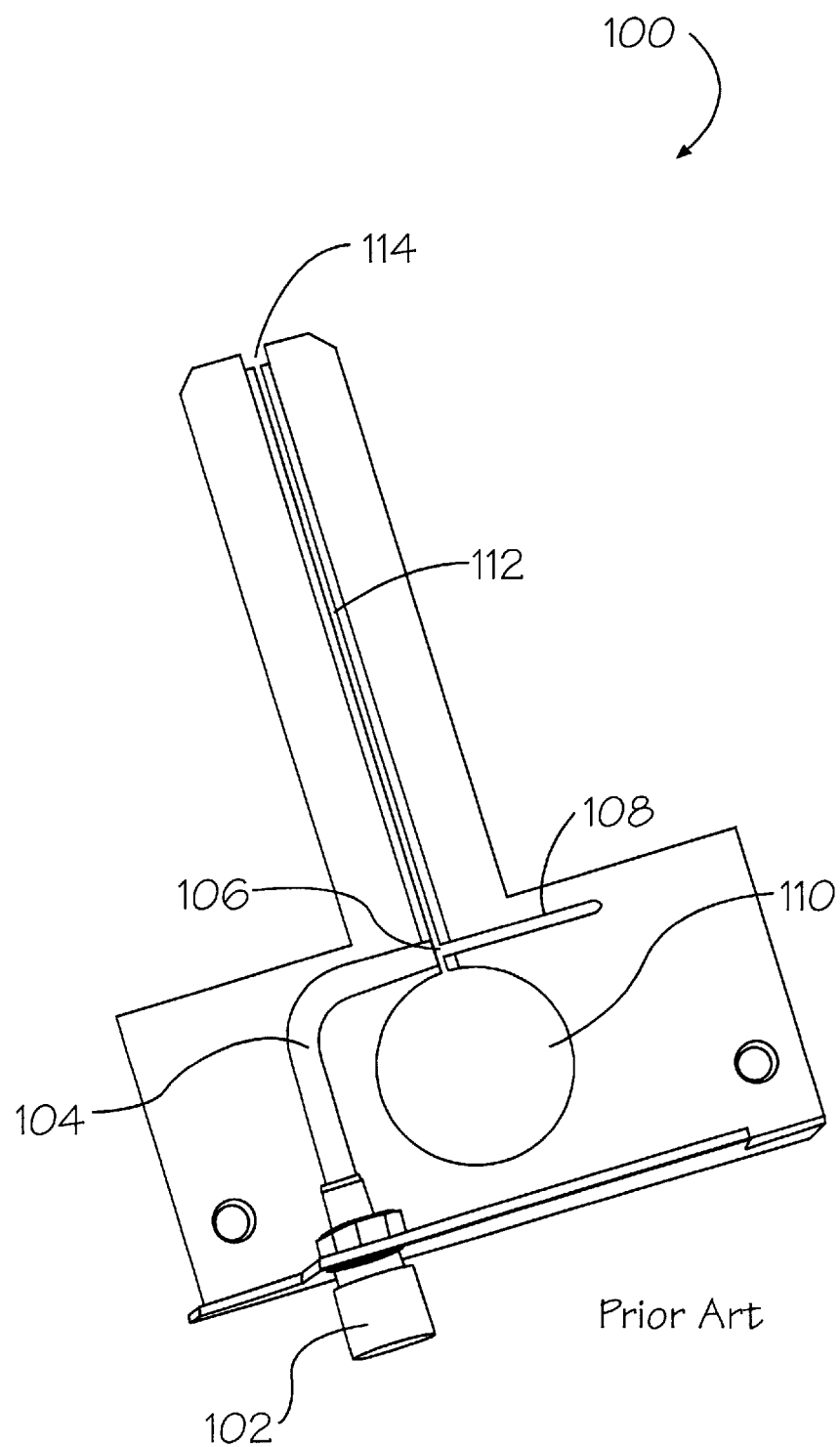
FIG. 1 is a schematic, plan view of a rigid slotline balun assembly of the prior art.

Referring first to FIG. 1, there is shown a schematic plan view of a slotline balun of the prior art, generally at reference number 100. Balun 100 is typically fabricated on an aluminum sheet. A coaxial connector 102 at the bottom edge of balun 100 allows the connection of an external, unbalanced transmission line, typically coaxial cable. The signal is carried from connector 102 along a coaxial cable 104 to a transition region 106. A stub section 108 and a slotline open circuit 110, both functionally connected at transition region 106, are provided for impedance matching and broadbanding of the input/output signal. Slotline 112 carries the signal to a terminus 114 where the signal is coupled to a slot radiator or other antenna element (not shown). While a transmitted signal is described, it will be obvious that balun 100 may function in a receiving capacity as well.

The electrical performance of balun 100 has been found to be satisfactory. impedance matching and insertion loss are acceptable across the operating bandwidth of interest. However, the mechanical properties of balun 100 are less than satisfactory. Because balun 100 must be precision machined into the aluminum sheet, manufacturing costs are high. In addition, the rigid metal structure has multiple mechanical stress points. In the course of temperature cycling, these stress points may lead to mechanical failure of the balun.

Figure 2:
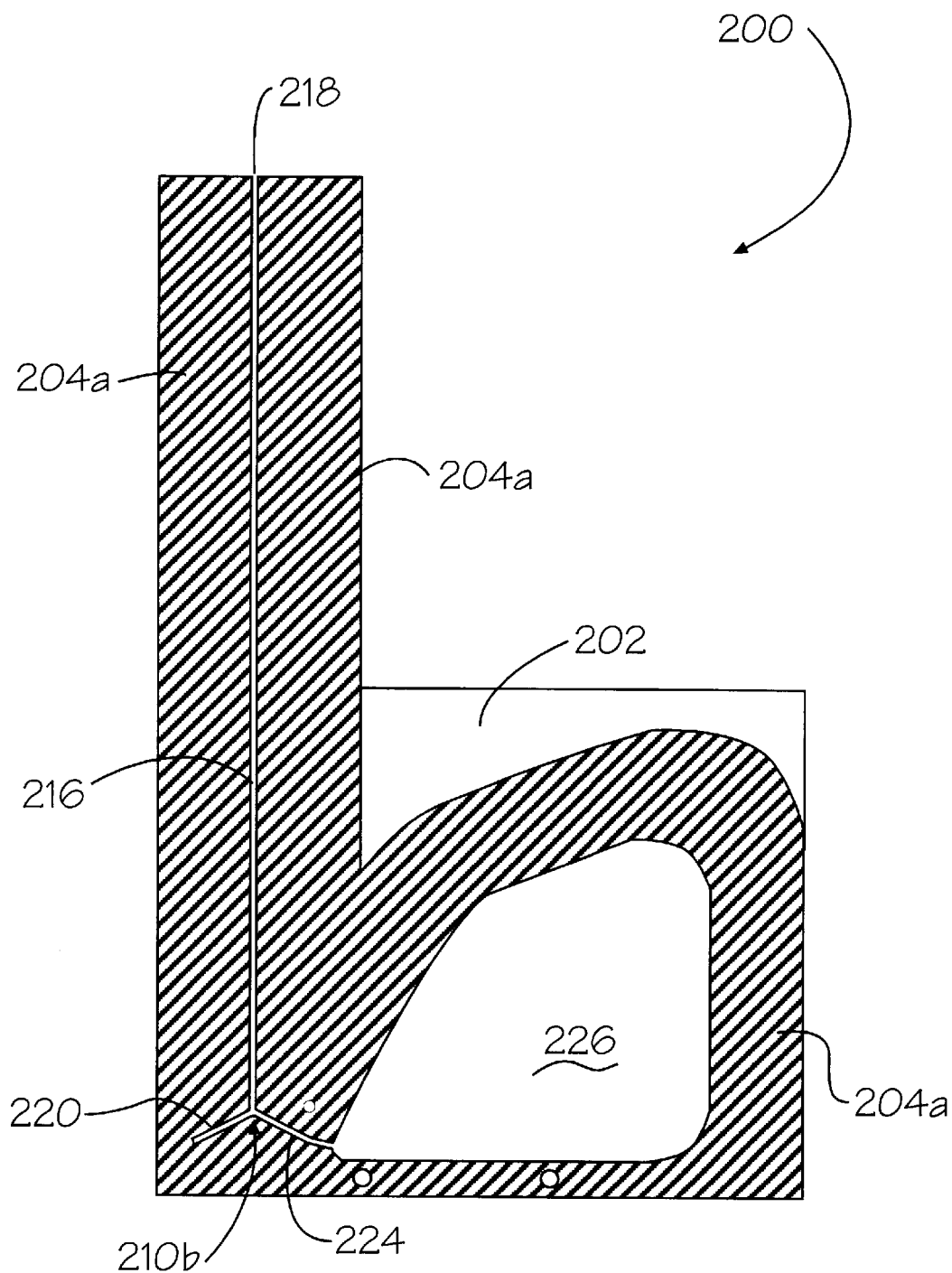
FIG. 2 is a top plan view of the flexible, wideband stripline balun in accordance with the invention.
Figure 3:
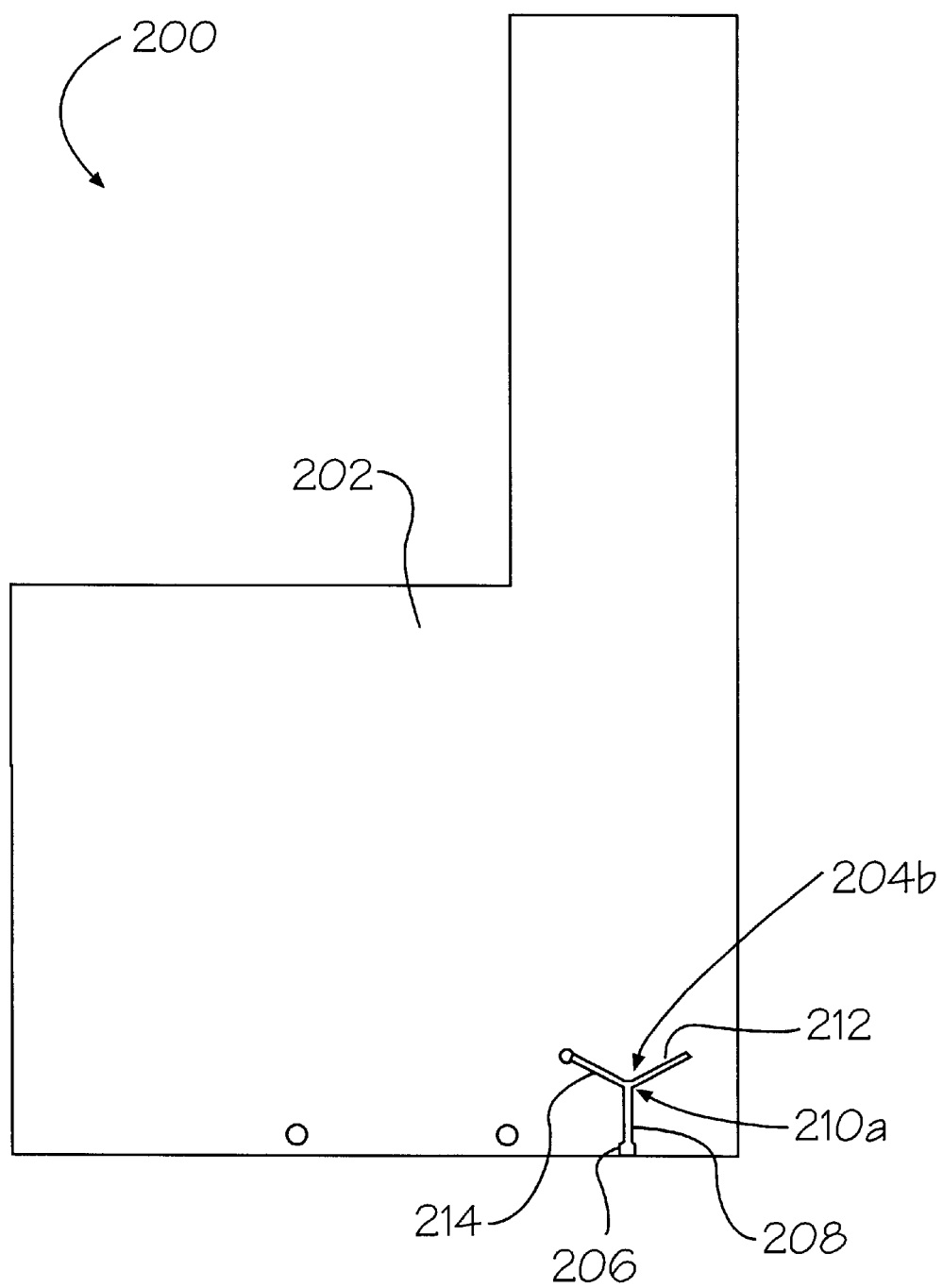
FIG. 3 is a bottom plan view of the flexible, wideband stripline balun of FIG. 2.

Referring now to FIGS. 2 and 3, there are shown front and back plan views, respectively, of the inventive wideband, flexible balun, generally at reference number 200. A thin substrate 202, typically 10 mil FR4 material, supports metallized patterns 204a, 204b disposed on both the front and back of substrate 202, respectively. On the rear side of substrate 202 (FIG. 3), an input pad 206 allows for the connection of an external, unbalanced transmission line (not shown) to a micro stripline 208 which terminates at junction 210a. An open circuit stub leg 212 and a short-circuited stub leg 214 are electrically connected to and radiate from junction 210a.

On the front side of substrate 202, a relatively large amount of metallized pattern 204a, typically copper, remains. A slotline 216 etched in metallized pattern 204a extends from junction 210b to a terminus 218. Typically, terminus 218 may be coupled to any type of balanced antenna (not shown) such as dipoles, slots, spirals, log-periodics, etc. In the example chosen for purposes of disclosure, terminus 218 would connect to a radiator slot (not shown), either directly or through a coupling dipole or similar coupling structure (not shown).

A short-circuited slotline branch 220 and an open-circuited slotline branch 224 are electrically connected to and radiate from junction 210b. Open circuit slotline branch 224 is a meandering line which defines a relatively large, irregular space 226. Junction points 210a and 210b, located on opposite surfaces of substrate 202, are placed directly over one another but are not directly electrically connected.

The combination of strip line 208 and slotline 216, in cooperation with stubs 212, 214, 220, 224, form the six-port network.

Figure 4:
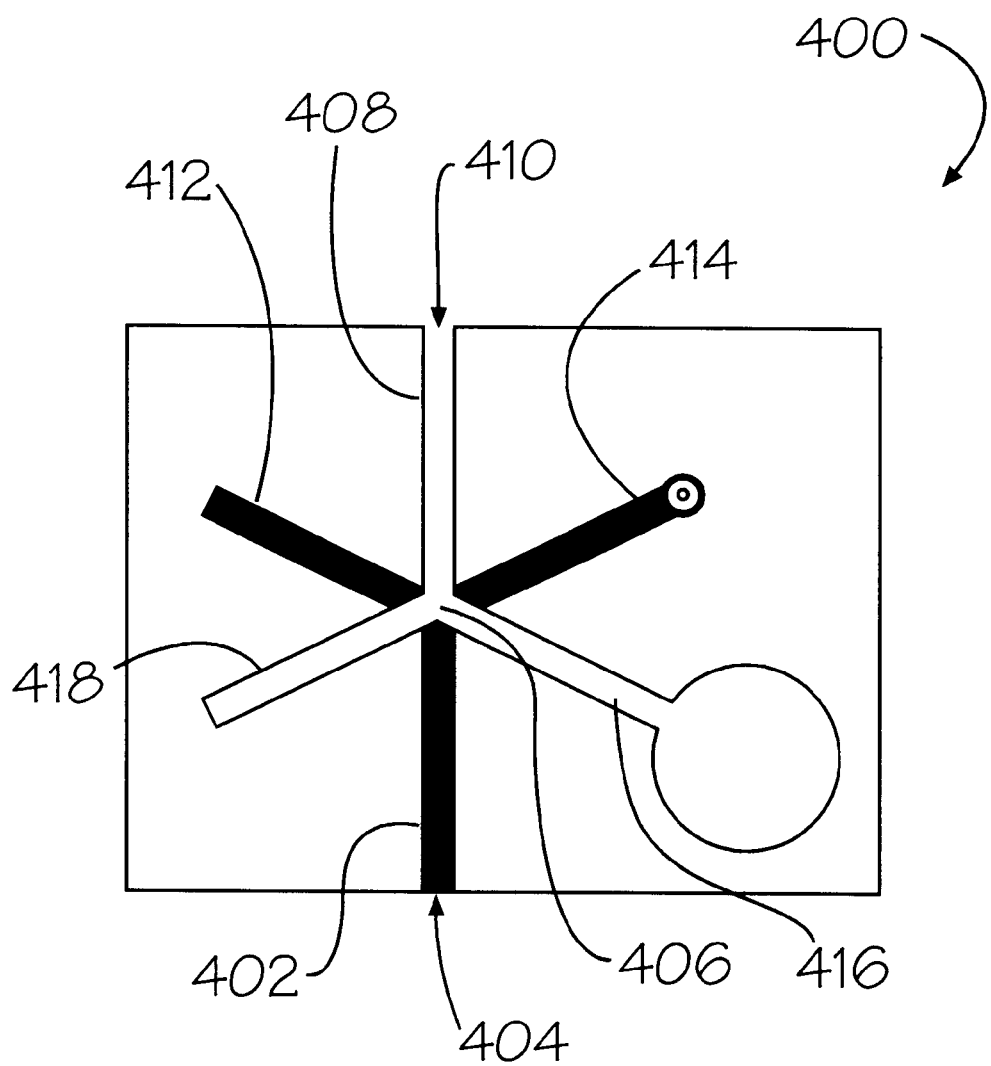
FIG. 4 a schematic view of a generalized six-port network.

Referring now to FIG. 4, there is shown a schematic representation of a generalized six-port network, generally at reference number 400. A stripline 402 feeds a signal from an input 404 to a junction 406. A slotline 408 carries a balanced signal from junction 406 to a terminus 410. Open and short circuit stripline branches 412 and 414, respectively, are connected at junction 406. Likewise, open and short circuit slotline branches 416 and 418, respectively, are also connected to junction 406. This combination forms a classic six-port network such as that utilized in the inventive balun.

Referring now again to FIGS. 2 and 3, in operation, an unbalanced RF signal is applied to the input 206 of the inventive balun 200. The unbalanced RF signal is conducted to junction 210a, where the interaction of balanced open and short-circuited stubs 212, 214, 220, 224 interact with the signal, which is induced into slotline 216. The balanced stubs 212, 214, 220, 224 create a very broadband unbalanced-to-balanced current transformer (balun) having minimal insertion loss, wherein the output signal current becomes well behaved a very short physical distance away from junction 210a, 210b. Micro stripline 208 may be meandered to include multiple quarter-wavelength transformers to provide additional degrees of freedom for impedance matching. The combination of micro stripline sections 206 and 208 provides the first tuning capability. The six-port network sections 212, 214, 220, 224, etc. converts the unbalanced current to a balanced current with a minimal insertion loss. The balanced signal (not shown) then travels along slotline 218 to an antenna (not shown) coupled at terminus 218.

Slotline 218 is shown in the embodiment chosen for purposes of disclosure, as a constant width section. In alternate embodiments, however, slotline 218 could be implemented as a variable width section. The width could vary as an exponential curve, for example, or the like. In summary, the inventive balun consists of three interacting sections: the uniform/non-uniform slotline; the six-port network; and the meandering micro stripline.

Because the inventive balun 200 may be readily manufactured using well known printed circuit technology, it is inexpensive. This means that changes to customize the balun operating frequency range may be made readily by changing printed circuit exposure masks. All other manufacturing processes remain unchanged. Also, because it is typically implemented on thin, flexible material (e.g., 10 mil FR4), the balun 200 may be added as a layer in a composite patch antenna lay-up. The inventive balun 200 exhibits excellent broadband performance and reliability even when thermally stressed.

Figure 6:
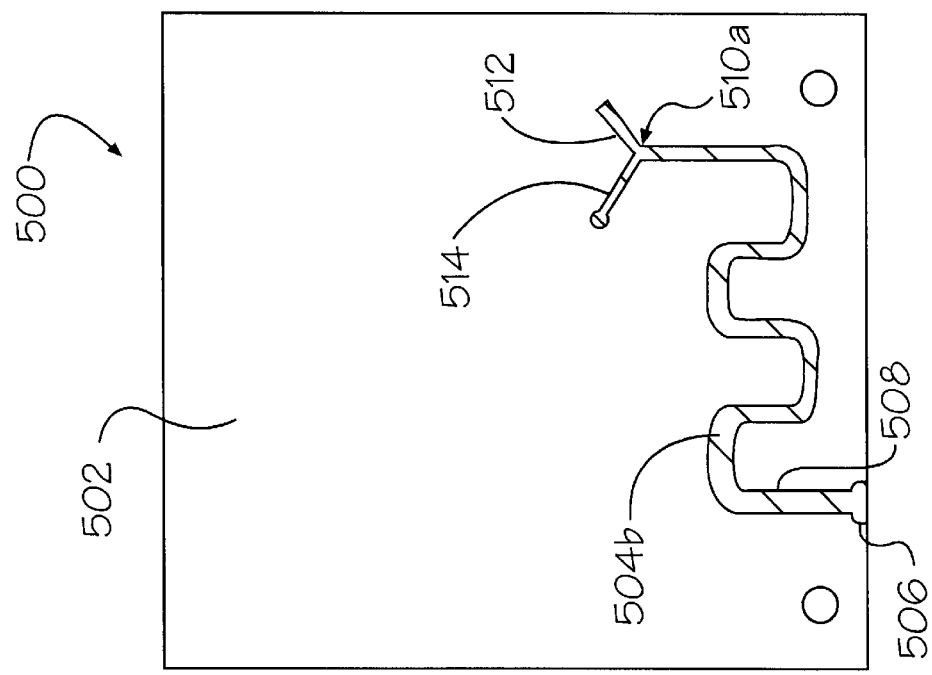
FIG. 6 is a bottom plan view of the flexible, stripline balun of FIG. 5
Figure 5:
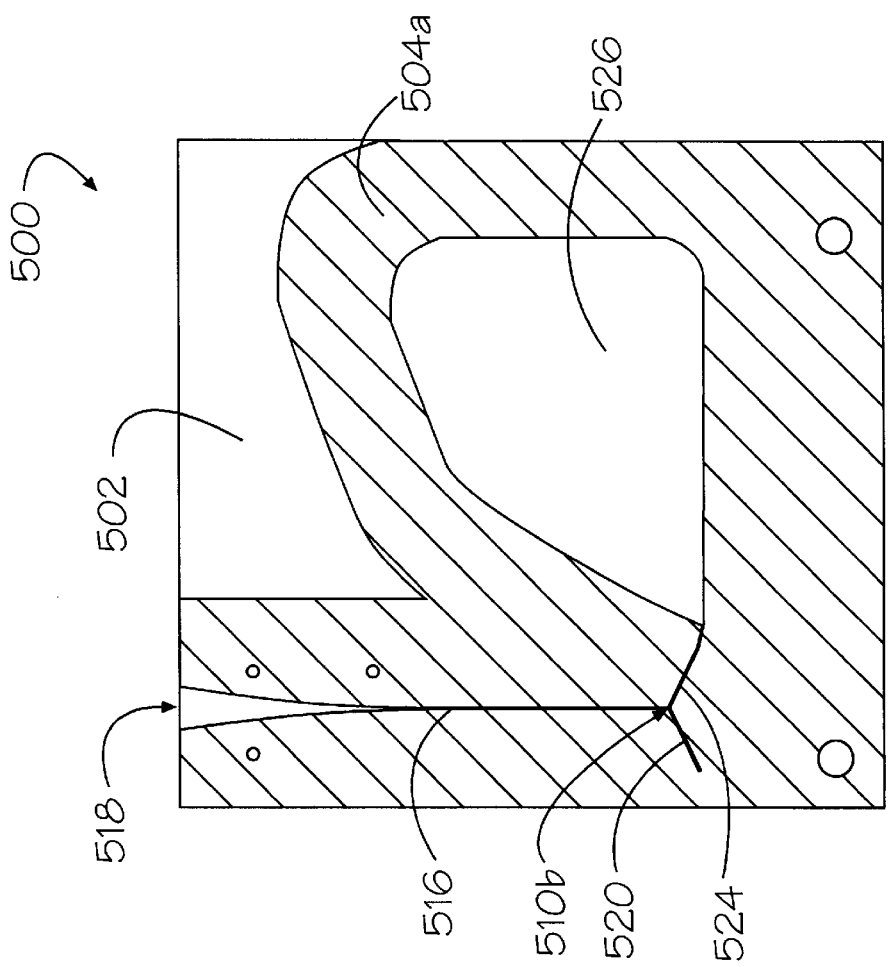
FIG. 5 is a top plan view of an alternate embodiment of the flexible, wideband stripline balun of the invention.

Referring now to FIGS. 5 and 6, there are shown front and back plan views, respectively, generally at reference number 500, of an alternate embodiment of the balun shown in FIGS. 3 and 4. A thin substrate 502, typically 10 mil FR4 material, supports metallized patterns 504a, 504b disposed on both the front and back sides of substrate 502, respectively. On the back side of substrate 502 (FIG. 6), an input pad 506 allows for the connection of an external, unbalanced transmission line (not shown) to a micro stripline 508 which terminates at junction 510a. Unlike micro stripline 208 (FIG. 3), micro stripline 508 is a meander line, which allows an even smaller balun to be constructed compared with the embodiment shown in FIGS. 2 and 3.

An open circuit stub leg 512 and a short-circuited stub leg 514 are electrically connected to and radiate from junction 510a. Open circuit stub 512 may exhibit a flair at its outboard terminus which may be used to help control the tuning and/or "Q" of the balun 500.

On the front side of substrate 502, a relatively large amount of metallized pattern 504a, typically copper, remains. A slotline 518 etched in metallized pattern 504a extends from junction 510b to a terminus 518. Slotline 518 may be flared in the vicinity of terminus 518 either to act independently as an antenna or to facilitate coupling to an attached radiating element (not shown) to which the balun 500 may be coupled. Typically, terminus 518 may be coupled to any type of balanced radiating elements such as dipoles, slots, spirals, log-periodics, etc.

A short-circuited slotline branch 520 and an open-circuited slotline branch 524 are electrically connected to and radiate from junction 510b. Open circuit slotline branch 524 is a meander line which defines a relatively large, irregular space 526. Junction points 510a and 510b, located on opposite surfaces of substrate 502, are aligned directly over one another but are not directly electrically connected.

The combination of strip line 508 and slotline 516, in cooperation with stubs 512, 514, 520, 524, form the six-port network described in detail hereinabove.

The inventive balun 200 has exhibited virtually identical VSWR performance to its expensive, aluminum plate, prior art versions.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A thin, broadband balun, comprising:
   a) a substrate having a first surface and a second surface and a first edge and a second edge;
   b) a meandering stripline disposed on said first surface and extending from a connection proximate from said first edge to a predefined interior junction point thereupon;

c) an open-circuit stripline stub disposed on said first surface and extending radially a predetermined distance from said junction point and being electrically connected to said stripline at said junction point;

d) a short-circuited stripline stub disposed on said first surface and extending radially a predetermined distance from said junction point and being electrically connected to said stripline at said junction point;

e) a slotline disposed on said second surface for interfacing with an external device, said slotline connecting said junction point and a terminus proximate said second edge;

f) an open-circuit slotline stub disposed on said second surface and extending radially a predetermined distance from said junction point and being electrically connected to said slotline at said junction point; and g) a short-circuited slotline stub disposed on said second surface and extending radially a predetermined distance from said junction point and being electrically connected to said slotline at said junction point.

2. The thin, broadband balun in accordance with claim 1, wherein said meandering stripline, said slotline, said open-circuit stripline stub, said short-circuited stripline stub, said open circuit slotline stub and said short-circuited slotline stub are electrically communicative at least one frequency and form a six-terminal network, whereby an unbalanced radio frequency electrical signal applied to said connection point is transformed to a balanced radio frequency signal at said terminus.

3. The thin, broadband balun as recited in claim 2, wherein said broadband balun comprises a two-sided printed circuit and wherein said meandering stripline, said open-circuit stripline stub, and said short-circuited stripline stub comprise conductive regions on a first side thereof and said slotline, said open circuit slotline stub, and said short-circuited slotline stub comprise features formed upon a second side thereof.

4. The thin, broadband balun as recited in claim 2, wherein said substrate comprises FR4 material.

5. The thin, broadband balun as recited in claim 3, wherein said FR4 material has a thickness of approximately 0.010 inch.

6. The thin, broadband balun as recited in claim 2, wherein said substrate is flexible.

7. The thin, broadband balun as recited in claim 1, wherein said meandering stripline provides a plurality of quarter-wavelength transformers, thereby providing additional degrees of freedom for impedance matching.

8. The thin, broadband balun as recited in claim 1, wherein said slotline disposed on said second surface comprises a variable width slotline.

9. The thin, broadband balun as recited in claim 8, wherein the width of said variable width slotline varies in accordance with an exponential curve.

10. The thin, broadband balun as recited in claim 1, wherein said slotline element (e) disposed on said second surface for interfacing with an external device comprises a flared section proximate said terminus, whereby said slotline is adapted to function as a radiator.

* * * * *